(12) United States Patent
Zheng et al.

(10) Patent No.: US 6,455,377 B1
(45) Date of Patent: Sep. 24, 2002

(54) METHOD TO FORM VERY HIGH MOBILITY VERTICAL CHANNEL TRANSISTOR BY SELECTIVE DEPOSITION OF SIGE OR MULTI-QUANTUM WELLS (MQWS)

(75) Inventors: Jia Zhen Zheng, Singapore (SG); Lap Chan, San Francisco, CA (US); Elgin Quek, Singapore (SG); Ravi Sundaresan, San Jose, CA (US); Yang Pan; James Yong Meng Lee, both of Singapore (SG); Ying Keung Leung, Hong Kong (HK); Yelehanka Ramachandramurthy Pradeep, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 71 days.

(21) Appl. No.: 09/765,040

(22) Filed: Jan. 19, 2001

(51) Int. Cl.[7] ............................................. H01L 21/336
(52) U.S. Cl. ..................... 438/268; 438/156; 438/269; 438/270; 438/137; 438/226; 438/212; 438/197; 438/285; 438/590; 257/12; 257/14; 257/15; 257/18; 257/192; 257/194; 257/330; 257/186; 357/4
(58) Field of Search ............................... 438/386, 268, 438/269, 137, 138, 226, 270, 212, 156, 197, 285, 590; 257/14, 12, 15, 18, 192, 194, 330, 186; 357/4, 58

(56) References Cited

U.S. PATENT DOCUMENTS

| | | | |
|---|---|---|---|
| 4,740,826 A | | 4/1988 | Chatterjee .................... 357/42 |
| 4,857,971 A | * | 8/1989 | Burnhan ........................ 357/4 |
| 4,884,119 A | * | 11/1989 | Miller ........................... 357/58 |
| 5,179,037 A | * | 1/1993 | Seabaugh ..................... 437/59 |
| 5,757,038 A | | 5/1998 | Tiwari et al. ................ 257/192 |
| 5,780,327 A | | 7/1998 | Chu et al. .................... 438/156 |
| 5,981,318 A | | 11/1999 | Blanchard .................... 438/162 |
| 6,027,975 A | * | 2/2000 | Hergenrother et al. ....... 438/268 |
| 6,197,641 B1 | * | 3/2001 | Hergenrother et al. ....... 438/268 |
| 6,326,650 B1 | * | 12/2001 | Allam ......................... 257/186 |

OTHER PUBLICATIONS

Bernhard–Hofer et al., Physica E, vol. 2, Issue 1–4; 1998, article "Growth and Characterization of Strained Si1–xGex Multi–Quantum Well Waveguide Photodetectors on (110) Si for 1.3 and 1.55 $\mu$m".

* cited by examiner

Primary Examiner—Caridad Everhart
Assistant Examiner—Belur V Keshavan
(74) Attorney, Agent, or Firm—George O. Saile; Rosemary L.S. Pike; Stephen G. Stanton

(57) ABSTRACT

A method of fabricating a vertical channel transistor, comprising the following steps. A semiconductor substrate having an upper surface is provided. A high doped N-type lower epitaxial silicon layer is formed on the semiconductor substrate. A low doped P-type middle epitaxial silicon layer is formed on the lower epitaxial silicon layer. A high doped N-type upper epitaxial silicon layer is formed on the middle epitaxial silicon layer. The lower, middle, and upper epitaxial silicon layers are etched to form a epitaxial layer stack defined by isolation trenches. Oxide is formed within the isolation trenches. The oxide is etched to form a gate trench within one of the isolation trenches exposing a sidewall of the epitaxial layer stack facing the gate trench. Multi-quantum wells or a stained-layer super lattice is formed on the exposed epitaxial layer stack sidewall. A gate dielectric layer is formed on the multi-quantum wells or the stained-layer super lattice and within the gate trench. A gate conductor layer is formed on the gate dielectric layer, filling the gate trench.

35 Claims, 2 Drawing Sheets

METHOD TO FORM VERY HIGH MOBILITY VERTICAL CHANNEL TRANSISTOR BY SELECTIVE DEPOSITION OF SIGE OR MULTI-QUANTUM WELLS (MQWS)

BACKGROUND OF THE INVENTION

Conventional transistors are fabricated horizontally. Prior art vertical channel transistors use epitaxial silicon (epi Si) as the vertical channel.

U.S. Pat. No. 5,757,038 to Tiwari et al. describes a silicon germanium (SiGe) vertical channel within a dual gate field effect transistor (FET).

U.S. Pat. No. 4,740,826 to Chatterjee describes a vertical transistor (Tx) with a tungsten (W) gate and doped epitaxial channel.

U.S. Pat. No. 5,981,318 to Blanchard describes a SiGe channel for a horizontal Tx.

U.S. Pat. No. 5,780,327 to Chu et al. describes a vertical double gate FET with a W gate and vertical channel.

The "Growth and characterization of strained $Si_{1-x}Ge_x$ multi-quantum well waveguide photodetectors on (110) Si for 1.3 and 1.55 µm," Bernhard-Höfer et al., Physica E, Vol. 2, Issue 1–4; Jul. 15, 1998, article describes the growth of pseudomorphic $Si_{1-x}Ge_x$ multi-quantum well p-i-n photodiodes on (110) Si by molecular beam epitaxy.

SUMMARY OF THE INVENTION

Accordingly, it is an object of the present invention to provide a method of fabricating a vertical channel transistor having a higher carrier mobility.

Another object of the present invention is to provide a method of fabricating a vertical channel SiGe multi-quantum well transistor having improved performance.

A further object of the present invention is to provide a method of fabricating a vertical channel transistor with a strained layer super lattice having improved carrier mobility.

Other objects will appear hereinafter.

It has now been discovered that the above and other objects of the present invention may be accomplished in the following manner. Specifically, a semiconductor substrate having an upper surface is provided. A high doped N-type lower epitaxial silicon layer is formed on the semiconductor substrate. A low doped P-type middle epitaxial silicon layer is formed on the lower epitaxial silicon layer. A high doped N-type upper epitaxial silicon layer is formed on the middle epitaxial silicon layer. The lower, middle, and upper epitaxial silicon layers are etched to form a epitaxial layer stack defined by isolation trenches. Silicon dioxide (oxide) is deposited to fill the isolation trenches followed by chemical mechanical planarization. The oxide is etched to form a gate trench within one of the trenches exposing a sidewall of the epitaxial layer stack facing the gate trench. SiGe multi-quantum wells are formed on the exposed epitaxial layer stack sidewall. A gate dielectric layer is formed on the multi-quantum wells and within the gate trench. A gate conductor layer is formed on the gate dielectric layer, filling the gate trench.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

A single quantum well refers to a thin (less than about 50 Å) layer of semiconductor with smaller energy band-gap sandwiched in wider band-gap semiconductor layers. In such a structure, the carrier motion in the smaller energy band-gap semiconductor is quantified in one direction across the layer, and carriers experience a two-dimensional motion along the layer. A super lattice refers to periodic artificial structures combining two lattice-mismatched semiconductors having different energy band-gaps.

Unless otherwise specified, all structures, layers, etc. may be formed or accomplished by conventional methods known in the prior art. While the method specifically described is for NMOS transistors, one skilled in the art will readily understand that by changing the epi (epitaxial) $N^+$—P—$N^+$ to $P^+$—N—$P^+$, the same method/procedure will give PMOS transistors.

Figure 1:
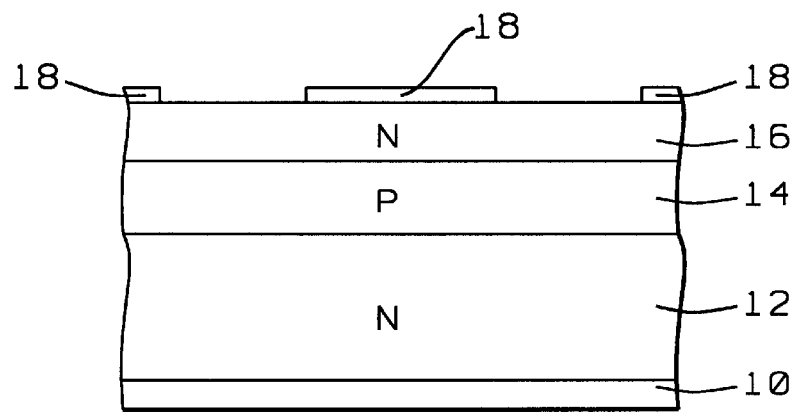
FIGS. 1 to 6 schematically illustrate in cross-sectional representation a preferred embodiment of the present invention.

Accordingly as shown in FIG. 1, starting semiconductor substrate 10 is understood to include an upper silicon layer, and may be a silicon substrate.

Formation of Epitaxial Layers

Epitaxial layers 12, 14, 16 are fabricated on the surface of substrate 10 using a suitable technique, such as a molecular beam epitaxial technique, a metal-organic chemical vapor deposition or atomic layer epitaxy, to form very abrupt transitions between N and P type doping materials.

Lower and upper epitaxial layers 12, 16, respectively, are preferably high doped N-type Si with a doping level preferably of about $1\ E^{19}cm^{-3}$ using either arsenic (As) or phosphorus (P) as dopants. Lower epitaxial layer 12 is preferably from about 500 to 10,000 Å thick. Upper epitaxial layer 16 is preferably from about 500 to 10,000 Å thick.

Middle epitaxial layer 14 is preferably low doped P-type Si with a doping level preferably from about 1 E 16 to 1 $E^{17}cm^{-3}$ using either boron (B), indium (In), or antimony (Sb) as dopants. Middle epitaxial layer 14 is preferably from about 300 to 5000 Å thick.

Dielectric film 18 is formed and patterned over upper epitaxial layer 16.

Formation of Trenches

Figure 2:
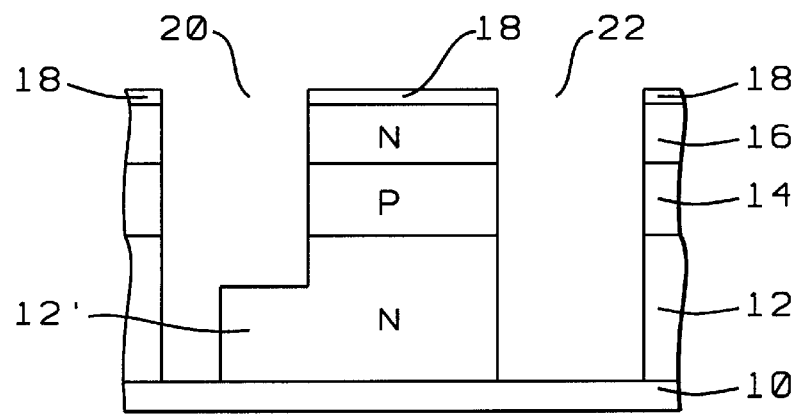

As shown in FIG. 2, epitaxial layers 12, 14, 16 are etched to form isolation trenches 20 and 22. Portion 12' of etched lower epitaxial layer 12 may extend into trench 20 which may be used to form an electrical connection, for example.

Deposition/Planarization of Gate Oxide

Figure 3:
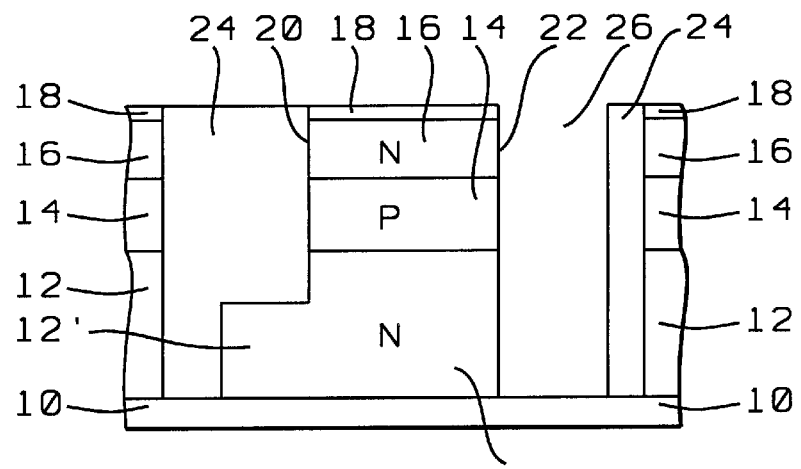

As shown in FIG. 3, a layer of dielectric film 24, such as silicon dioxide (oxide), is deposited over the structure, filling isolation trenches 20, 22, and is then planarized, preferably by chemical mechanical polishing (CMP).

Gate Trench Pattern and Etch

Planarized oxide layer 24 is patterned and etched to form gate trench 26. Planarized oxide layer 24 may be patterned, for example, by forming a layer of patterned photoresist (not shown) over oxide layer 24 and epitaxial stack layer, then etching oxide layer 24 using the patterned photoresist layer as a mask.

Gate trench 26 is preferably from about 500 to 10,000 Å wide, and is more preferably from about 800 to 3000 Å wide.

Growth of SiGe, MOW, or Strained-Layer Super Lattice

Figure 4:
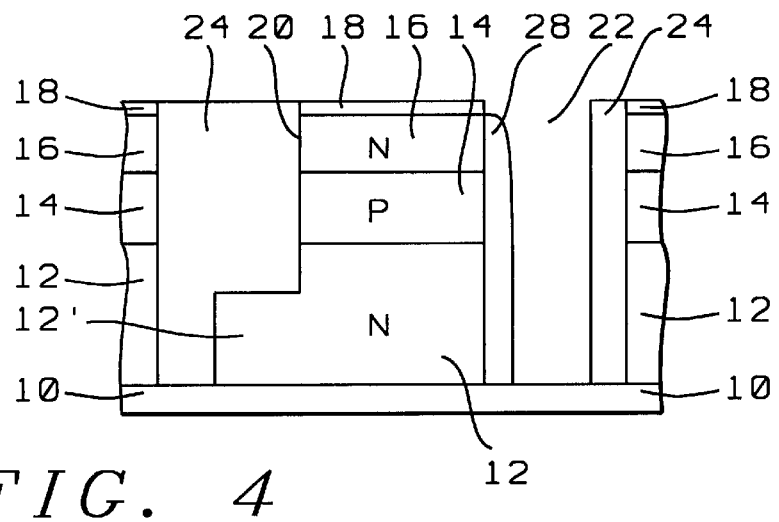

As shown in FIG. 4, in a key step of the invention, multi-quantum wells (MQWs), or strained-layer super lattice, 28 are formed within trench 22 adjacent the exposed sidewalls of etched epitaxial layers 12, 14, 16. MQWs 28 is preferably from about 50 to 2000 Å wide, and more preferably from about 80 to 1000 Å wide.

MQWs 28 are comprised of multiple single quantum wells which are thin layers of semiconductor with smaller energy band-gap sandwiched in wider band-gap semiconductor layers. These alternating smaller energy band-gap semiconductor layers/wider energy band-gap semiconductor layers may be comprised of SiGe—Si; GaAs—Si; or GaAs—AlGaAs, and is preferably silicon-germanium (Si—Ge), i.e. Si/Ge/Si/Ge/Si/Ge . . . Si/Ge/Si. Germanium has a smaller energy band-gap than silicon, and hence the carriers (electrons and holes) are confined in the wells (germanium). The carrier mobility can be much higher in MQWs than in single crystal silicon (Si).

The present invention preferably utilizes either Si/Ge/Si/Ge/Si/Ge . . . Si/Ge/Si or Si/SiGe/Si/SiGe . . . Si/SiGe/Si MQWs 28 as channel material to improve carrier mobility.

Si/Ge/Si/Ge/Si/Ge . . . Si/Ge/Si MQWs 28, for example, are preferably selectively grown, and may be also formed by metal-organic chemical vapor deposition (MOCVD), molecular beam epitaxy (MBE), or atomic layer epitaxy (ALE). Strained-layer super lattice with ultra-thin Si and Ge alternating layers may also be used where the carriers in the Ge layers are quantum mechanically coupled to adjacent Ge layers.

Formation of Gate Dielectric Layer

Figure 5:
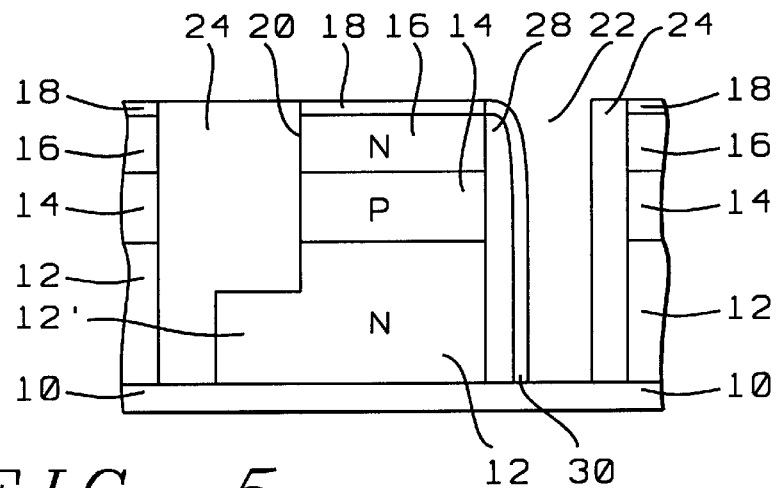

As shown in FIG. 5, gate dielectric layer 30 is then formed over MQWs 28 to a thickness of about 5 to 100 Å, and more preferably from about 8 to 50 Å. Gate dielectric layer 30 may be formed of a high-k material and is preferably formed of silicon dioxide ($SiO_2$).

Formation of Gate Conductor Layer

Figure 6:
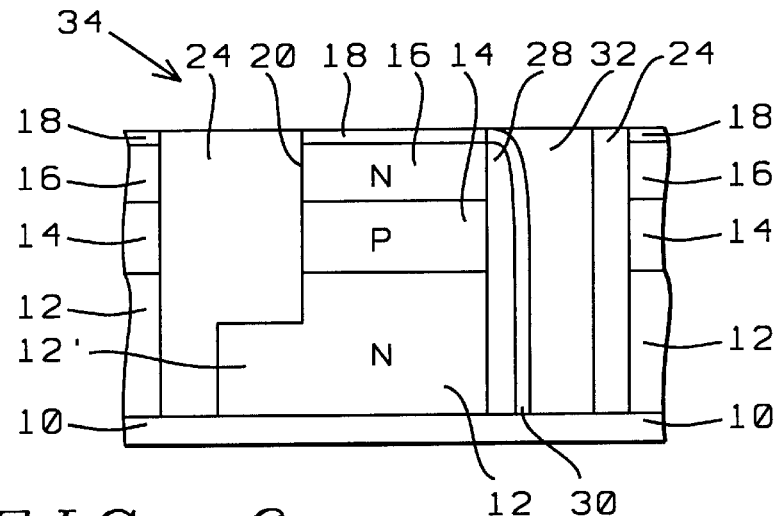

As shown in FIG. 6, planarized gate conductor layer 32 is formed within gate trench 26 and filling gate trench 26. Gate conductor layer 32 may be comprised of Al, Ti, or TiN, and is preferably comprised of polysilicon (poly), tungsten (W), or titanium (Ti). Gate conductor layer 32 is preferably planarized by CMP.

Contacts to the gate electrode 32 and source/drain (top and bottom N-type epitaxial Si, for example) may be formed by conventional methods.

This completes the formation of the vertical channel transistor 34.

Advantages of the Present Invention

The advantages of the present invention include:

1) carrier mobility is much higher in the MQWs than in single crystal silicon;

2) transistor performance is improved by the use of the Si/Ge/Si/Ge/Si/Ge . . . Si/Ge/Si or Si/SiGe/Si/SiGe . . . Si/SiGe/Si MQWs; and 3) transistor performance is improved by the use of a strained-layer super lattice.

While particular embodiments of the present invention have been illustrated and described, it is not intended to limit the invention, except as defined by the following claims.

We claim:

1. A method of fabricating a vertical channel transistor, comprising the steps of:

a) providing a semiconductor substrate having an upper surface;

b) forming a high doped N-type lower epitaxial silicon layer on said semiconductor substrate;

c) forming a low doped P-type middle epitaxial silicon layer on said lower epitaxial silicon layer;

d) forming a high doped N-type upper epitaxial silicon layer on said middle epitaxial silicon layer;

e) etching said lower, middle, and upper epitaxial silicon layers to form a epitaxial layer stack defined by isolation trenches;

f) forming oxide within said isolation trenches;

g) etching said oxide to form a gate trench within one of said trenches exposing a sidewall of said epitaxial layer stack facing said gate trench;

h) forming multi-quantum wells or a strained-layer super lattice on said exposed epitaxial layer stack sidewall;

i) forming a gate dielectric layer on said multi-quantum wells or said strained layer super lattice and within said gate trench; and j) forming a gate conductor layer on said gate dielectric layer, filling said gate trench.

2. The method of claim 1, wherein said high doped N-type lower and upper epitaxial silicon layers have a doping level of about 1 E 19 $cm^{-3}$, and said middle low doped P-type middle epitaxial layer has a doping level of from about 1 E 16 to 1 E 17 $cm^{-3}$.

3. The method of claim 1, wherein said N-type lower and upper epitaxial silicon layers are doped with dopants selected from the group comprising As and P; and said P-type middle epitaxial silicon layer is doped with dopants selected from the group comprising B, In, and Sb.

4. The method of claim 1, wherein said lower, middle and upper epitaxial silicon layers are formed using a method selected from the group consisting of a molecular beam epitaxial technique (MBE); a metal-organic chemical vapor deposition (MOCVD), and atomic layer epitaxy (ALE).

5. The method of claim 1, wherein said lower epitaxial layer is from about 500 to 10,000 Å thick, said middle epitaxial layer is from about 300 to 5000 Å thick; and said upper epitaxial layer is from about 500 to 10,000 Å thick.

6. The method of claim 1, further including a patterned dielectric film on said lower, middle, and upper epitaxial silicon layers.

7. The method of claim 1, wherein said gate trench is from about 500 to 10,000 Å wide.

8. The method of claim 1, wherein said multi-quantum wells or said strainedlayer super lattice are comprised of alternating layers of a pair of materials selected from the group comprising SiGe—Si, GaAs—Si, AlGaAs—GaAs, and Si—Ge.

9. The method of claim 1, wherein said multi-quantum wells or said strained-layer super lattice are comprised of alternating layers of: Si and Ge; or SiGe and Si.

10. The method of claim 1, wherein said multi-quantum wells or said strained-layer super lattice are each from about 50 to 10,000 Å wide.

11. The method of claim 1, wherein said multi-quantum wells or said strained-layer super lattice are each selectively grown.

12. The method of claim 1, wherein said multi-quantum wells or said strainedlayer super lattice are each formed by metal-organic chemical vapor deposition (MOCVD).

13. The method of claim 1, wherein said multi-quantum wells or said strained-layer super lattice are each formed by molecular beam epitaxy (MBE) or atomic layer epitaxy (ALE).

14. The method of claim 1, wherein said gate dielectric layer is from about 5 to 10 Å thick, and said gate conductor layer is from about 1000 to 10,000 Å thick and is formed from a material selected from the group consisting of polysilicon, tungsten, and titanium.

15. A method of fabricating a vertical channel transistor, comprising the steps of:
 a) providing a semiconductor substrate having an upper surface;
 b) forming a high doped N-type lower epitaxial silicon layer on said semiconductor substrate; said high doped N-type lower epitaxial silicon layer having a doping level of about $1\ E\ 19\ cm^{-3}$;
 c) forming a low doped P-type middle epitaxial silicon layer on said lower epitaxial silicon layer; said low doped P-type middle epitaxial silicon layer having a doping level of from about $1\ E\ 16$ to $1\ E\ 17\ cm^{-3}$;
 d) forming a high doped N-type upper epitaxial silicon layer on said middle epitaxial silicon layer; said high doped N-type upper epitaxial silicon layer having a doping level of about $1\ E\ 19\ cm^{-3}$;
 e) etching said lower, middle, and upper epitaxial silicon layers to form a epitaxial layer stack defined by isolation trenches;
 f) forming oxide within said isolation trenches;
 g) etching said oxide to form a gate trench within one of said isolation trenches exposing a sidewall of said epitaxial layer stack facing said gate trench;
 h) forming Si—Ge multi-quantum wells or stained-layer super lattice on said exposed epitaxial layer stack sidewall;
 i) forming a gate dielectric layer on said multi-quantum wells or said stained-layer super lattice and within said gate trench; and
 j) forming a gate conductor layer on said gate dielectric layer, filling said gate trench.

16. The method of claim 15, wherein said N-type lower and upper epitaxial silicon layers are doped with dopants selected from the group comprising As and P; and said P-type middle epitaxial silicon layer is doped with dopants selected from the group comprising B, In, and Sb.

17. The method of claim 15, wherein said lower, middle and upper epitaxial silicon layers are formed using a molecular beam epitaxial technique (MBE), metalorganic chemical vapor deposition (MOCVD), or atomic layer epitaxy (ALE).

18. The method of claim 15, wherein said lower epitaxial layer is from about 500 to 10,000 Å thick, said middle epitaxial layer is from about 300 to 5000 Å thick; and said upper epitaxial layer is from about 500 to 10,000 Å thick.

19. The method of claim 15, further including a patterned dielectric film on said lower, middle, and upper epitaxial silicon layers.

20. The method of claim 15, wherein said gate trench is from about 500 to 10,000 Å wide.

21. The method of claim 15, wherein said multi-quantum wells or said strained-layer super lattice are each from about 50 to 10,000 Å wide.

22. The method of claim 15, wherein said multi-quantum wells or said strained-layer super lattice are each selectively grown.

23. The method of claim 15, wherein said multi-quantum wells or said strained-layer super lattice are each formed by metal-organic chemical vapor deposition (MOCVD).

24. The method of claim 15, wherein said multi-quantum wells or said strained-layer super lattice are each formed by molecular beam epitaxy (MBE) or atomic layer epitaxy (ALE).

25. The method of claim 15, wherein said gate dielectric layer is from about 5 to 100 Å thick, and said gate conductor layer is from about 1000 to 10,000 Å thick and is formed from a material selected from the group consisting of polysilicon, tungsten, and titanium.

26. A method of fabricating a vertical channel transistor, comprising the steps of:
 a) providing a semiconductor substrate having an upper surface;
 b) forming a high doped N-type lower epitaxial silicon layer on said semiconductor substrate; said high doped N-type lower epitaxial silicon layer having a doping level of about $1\ E\ 19\ cm^{-3}$; said N-type lower epitaxial silicon layer being doped with dopants selected from the group comprising As and P;
 c) forming a low doped P-type middle epitaxial silicon layer on said lower epitaxial silicon layer; said low doped P-type middle epitaxial silicon layer having a doping level of from about $1\ E\ 16$ to $1\ E\ 17\ cm^{-3}$; aid P-type middle epitaxial silicon layer being doped with dopants selected from the group comprising B, In, and Sb;
 d) forming a high doped N-type upper epitaxial silicon layer on said middle epitaxial silicon layer; said high doped N-type upper epitaxial silicon layer having a doping level of about $1\ E\ 19\ cm^{-3}$; said N-type upper epitaxial silicon layer being doped with dopants selected from the group comprising As and P;
 e) etching said lower, middle, and upper epitaxial silicon layers to form a epitaxial layer stack defined by isolation trenches;
 f) forming oxide within said isolation trenches;
 g) etching said oxide to form a gate trench within one of said isolation trenches exposing a sidewall of said epitaxial layer stack facing said gate trench;
 h) forming Si—Ge multi-quantum wells or a strained-layer super lattice on said exposed epitaxial layer stack sidewall;
 i) forming a gate dielectric layer on said multi-quantum wells or said strained-layer super lattice and within said gate trench; and
 j) forming a gate conductor layer on said gate dielectric layer, filling said gate trench.

27. The method of claim 26, wherein said lower, middle and upper epitaxial silicon layers are formed using a method selected from the group consisting of a molecular beam epitaxial technique (MBE); a metal-organic chemical vapor deposition (MOCVD), and atomic layer epitaxy (ALE).

28. The method of claim 26, wherein said lower epitaxial layer is from about 500 to 10,000 Å thick, said middle epitaxial layer is from about 300 to 5000 Å thick; and said upper epitaxial layer is from about 500 to 10,000 Å thick.

29. The method of claim 26, further including a patterned dielectric film on said lower, middle, and upper epitaxial silicon layers.

30. The method of claim 26, wherein said gate trench is from about 500 to 10,000 Å wide.

31. The method of claim 26, wherein said multi-quantum wells or said stainedlayer super lattice are each from about 50 to 10,000 Å wide.

32. The method of claim 26, wherein said multi-quantum wells or said strained-layer super lattice are each selectively grown.

33. The method of claim 26, wherein said multi-quantum wells or said stained-layer super lattice are each formed by a method selected from the group consisting of a metal-organic chemical vapor deposition (MOCVD), and atomic layer epitaxy (ALE).

34. The method of claim 26, wherein said multi-quantum wells or said stained-layer super lattice are each formed by molecular beam epitaxy (MBE).

35. The method of claim 26, wherein said gate dielectric layer is from about 5 to 10 Å thick, and said gate conductor layer is from about 1000 to 10,000 Å thick and is formed from a material selected from the group consisting of polysilicon, tungsten, and titanium.

* * * * *